(12) United States Patent
Pernyeszi

(10) Patent No.: US 6,215,334 B1
(45) Date of Patent: Apr. 10, 2001

(54) ANALOG SIGNAL PROCESSING CIRCUIT WITH NOISE IMMUNITY AND REDUCED DELAY

(75) Inventor: Joseph Pernyeszi, Scotts Valley, CA (US)

(73) Assignee: General Electronics Applications, Inc., Scotts Valley, CA (US)

( * ) Notice: Subject to any disclaimer, the term of this patent is extended or adjusted under 35 U.S.C. 154(b) by 0 days.

(21) Appl. No.: 09/290,968

(22) Filed: Apr. 13, 1999

Related U.S. Application Data

(63) Continuation-in-part of application No. 08/957,672, filed on Oct. 24, 1997, now Pat. No. 5,969,547.

(51) Int. Cl.[7] .................................................... H03K 5/22
(52) U.S. Cl. ............................. 327/73; 327/205; 327/18
(58) Field of Search ................................ 327/50, 71, 72, 327/379, 205, 551, 206, 552, 73, 18, 21

(56) References Cited

U.S. PATENT DOCUMENTS

| | | | |
|---|---|---|---|
| 5,019,722 | 5/1991 | Hess et al. | 327/206 |
| 5,061,859 | 10/1991 | Lovelace et al. | 327/514 |
| 5,266,884 | * 11/1993 | Agiman | 327/72 |
| 5,341,033 | 8/1994 | Koker | 327/79 |

* cited by examiner

Primary Examiner—Dinh T. Le
(74) Attorney, Agent, or Firm—Townsend and Townsend and Crew LLP

(57) ABSTRACT

An improved pulse detection circuit provides for a reduced delay response and noise immunity. The pulse detection circuit includes a comparator with a biasing circuit providing first and second biasing signal states. The biasing signal states are adjustably delayed relative to the detected signal.

6 Claims, 7 Drawing Sheets

ANALOG SIGNAL PROCESSING CIRCUIT WITH NOISE IMMUNITY AND REDUCED DELAY

CROSS-REFERENCES TO RELATED APPLICATIONS

This application is a continuation-in-part of Ser. No. 08/957,672, filed Oct. 24, 1997, U.S. Pat. No. 5,969,547, the disclosure of which is incorporated herein by reference.

BACKGROUND OF THE INVENTION

The present invention relates to the field of signal detection. More specifically, one embodiment of the invention provides an improved circuit for detecting a signal which is a pulse stream with at least some predetermined characteristics using those predetermined conditions to detect the pulse stream accurately through noise added to the signal.

Pulse detection is a well-known form of signal detection. Typically, a binary (i.e., comprising logical "0"'s or "1"'s) data stream is encoded as pulses in a pulse stream. The presence of a pulse in a certain time window encodes for a logical "1" and the absence of a pulse in the time window encodes for a logical "0". In a variation of such a system, pulse widths carry the information, with a pulse's width representing a digital value. With this "pulse width encoding", there are a limited number of valid widths a pulse can have. In yet another variation, information is encoded in the falling or rising edges of a signal. Regardless of how the information is encoded, accurate detection and decoding rely on precise detection of the beginnings and/or ends of pulses.

Pulse detection is needed in, for example, modems, barcode readers, and optically-coupled transmitter/receiver pairs. The latter includes fiber optic systems and optocouplers.

In such systems, the information is clearly encoded and the pulses are transmitted with very sharp rising and falling edges. However, during transmission, pulse edges get distorted due to channel bandwidth limitations, detection circuit bandwidth limitations and noise.

A detection circuit normally amplifies an incoming signal and then applies the amplified signal to a decision circuit. If the level of the amplified signal is below a predetermined level (the "detection threshold"), the decision circuit outputs a logical "0" as its estimation of the digital value encoded in the signal. If the signal is above the detection threshold, then the decision circuit outputs a logical "1".

An example of a known detection circuit 10 is shown in FIG. 1. Detection circuit 10 is shown comprising an amplifier 12, a peak detector 14 and ad comparator 16. Waveforms at nodes 20, 22, 24, 26 and 28 of detection circuit 10 are shown in FIG. 2 as waveforms W20, W22, W24, W26 and W28, respectively. The top portion of FIG. 2 shows the original signal which, after transmission and amplification by amplifier 12, is waveform W20. The signal at node 20 is applied to peak detector 14, result in a positive peak signal (W22) and a negative peak signal (W24), which are averaged (W26) and used as the detection threshold, which comparator 16 compares with the amplified input signal from node 20. Comparator 16 outputs a logical "1" at node 28 if node 20 is more positive than the sum signal at node 26, otherwise it outputs a logical "0". The output of comparator 16 changes when the signal at node 20 is about halfway between its positive and negative peaks.

Another known detection circuit 30 is shown in FIG. 3, with the waveforms shown in FIG. 4. While detection circuit 30 is more complex than decision circuit 10 shown in FIG. 1, it has additional capabilities. For example, detection circuit 30 has peak detectors 31 that are resetable. Each peak detector 31 acquires an updated peak value after each positive or negative transition of the output signal. Each peak detector 31 has a comparator 34 with a small hysteresis to prevent oscillations near the switching point. As with detection circuit 10, the input signal is amplified by an amplifier 32, and the outputs of peak detectors 31 are averaged at node 56 and used as the threshold voltage for comparator 38. The output of detection circuit 30 is at node 60. That output is also used to reset the switches in peak detectors 31, as the output signal at node 60 is fed to edge detectors 42 (one directly and one after being inverted by an inverter 40) coupled to the switches.

Waveforms at nodes 50, 52, 54, 56, 58, 60, and 64 of detection circuit 30 are shown in FIG. 4 as waveforms W50, W52, W54, W56, W58, W60, W62 and W64, respectively.

Yet another detection circuit 70 is shown in FIG. 5, with associated waveforms shown in FIG. 6. Detection circuit provides an output response with less delay than other detection circuits, and has better transition detection, but requires a noise-free environment. The increased noise sensitivity comes from a peaking circuit 82, which is needed for the improved signal transition detection. Peaking circuit 82 amplifies noise and interference more than the signal. Consequently, at the output of the peaking circuit, the signal-to-noise ratio is much worse than at the input. This makes the circuit unreliable in noisy environments. When the noise is amplified, multiple transitions might be spuriously detected at transition points, such as t1–t5 shown in FIG. 6, where only single transitions should have been detected.

From the above it is seen that an improved detection circuit is needed.

SUMMARY OF THE INVENTION

An improved detection circuit is provided by virtue of the present invention. In one embodiment, a detection circuit according to the present invention includes a biasing circuit for outputting a bias signal having a first state and a second state, and coupled to a comparator for comparing an input signal to the bias signal to produce a digital bi-level signal representing the detected signal. A delay circuit is coupled to the comparator output for producing a delayed version of the digital bi-level signal. A switch coupled to the biasing circuit and to the delay circuit, switches the bias signal between the first and second states responsive to the delayed version of the digital bi-level signal thereby providing a detection circuit that has the advantage that the threshold may be adjusted based on knowledge of the input signal and the circuit has a high noise margin. The circuit is useful where transitions must be detected with high accuracy.

A further understanding of the nature and advantages of the inventions herein may be realized by reference to the remaining portions of the specification and the attached drawings.

DESCRIPTION OF THE SPECIFIC EMBODIMENTS

Figure 1:
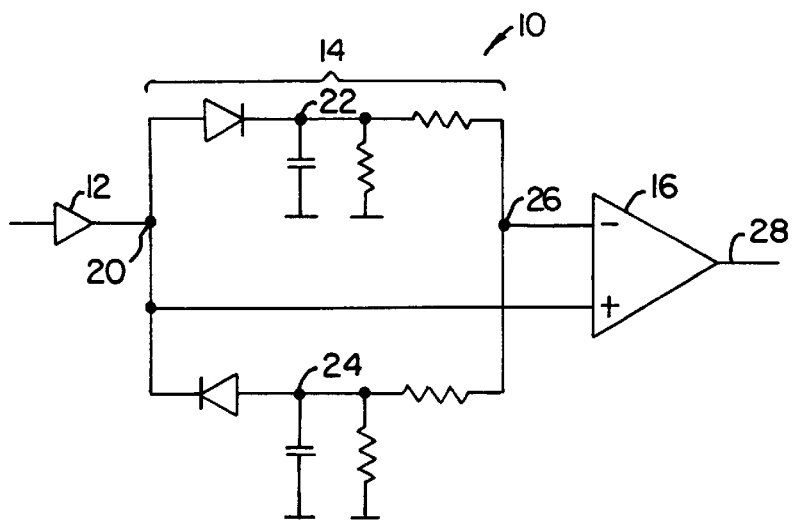
FIG. 1 is a schematic diagram of a prior art pulse detection circuit.
Figure 2:
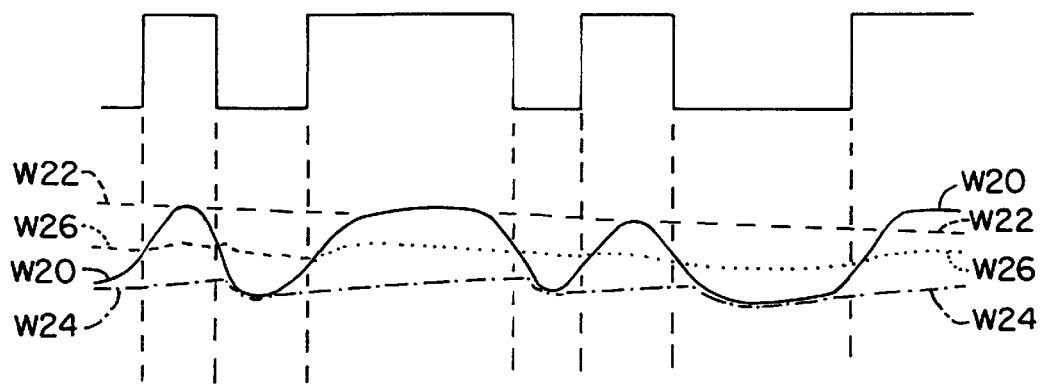
FIG. 2 is a set of waveforms of signals at nodes of the pulse detection circuit shown in FIG. 1.
Figure 3:
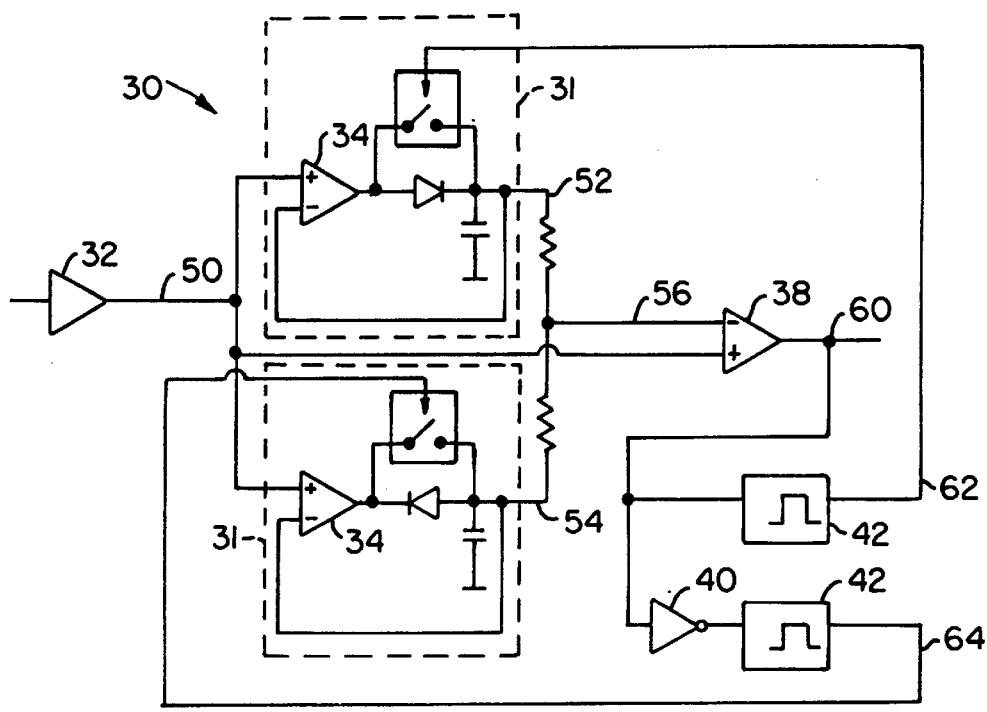
FIG. 3 is a schematic diagram of another prior art pulse detection circuit.
Figure 4:
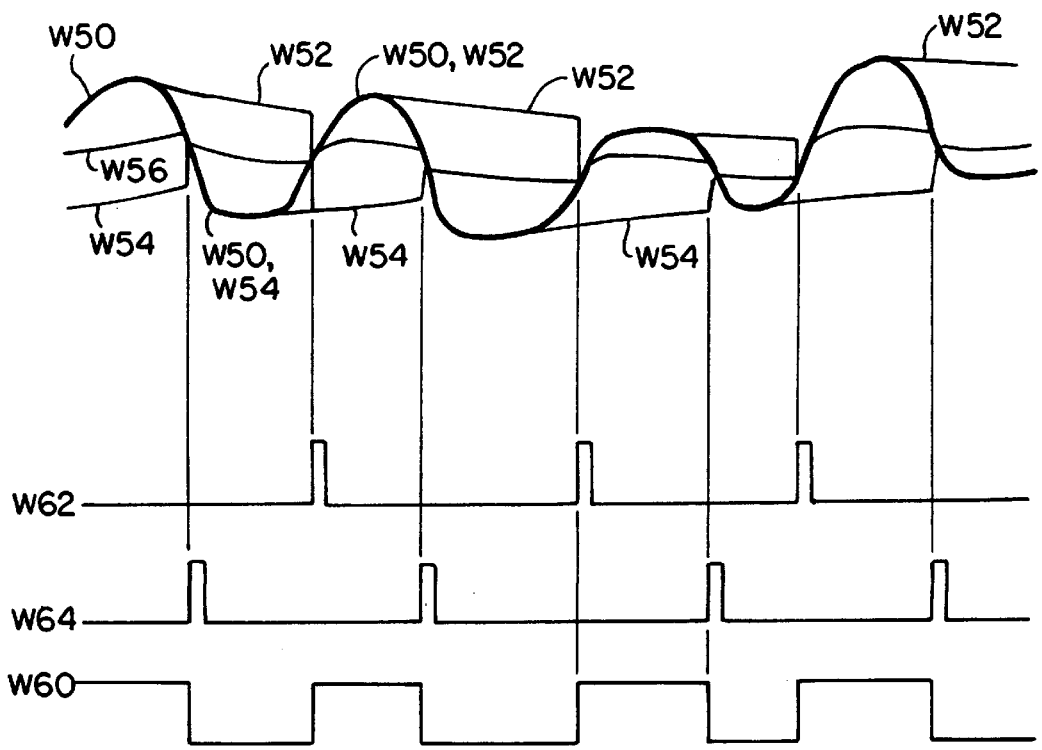
FIG. 4 is a set of waveforms of signals at nodes of the pulse detection circuit shown in FIG. 3.
Figure 5:
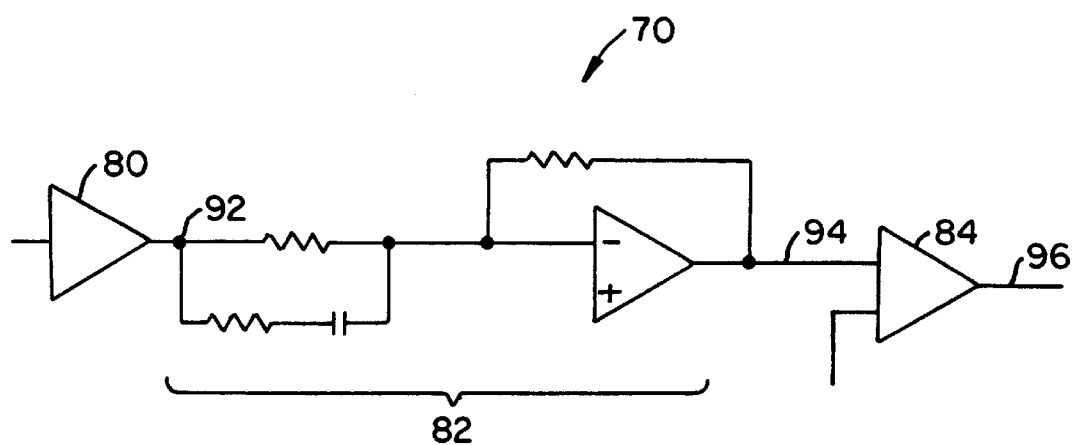
FIG. 5 is a schematic diagram of yet another prior art pulse detection circuit.
Figure 6:
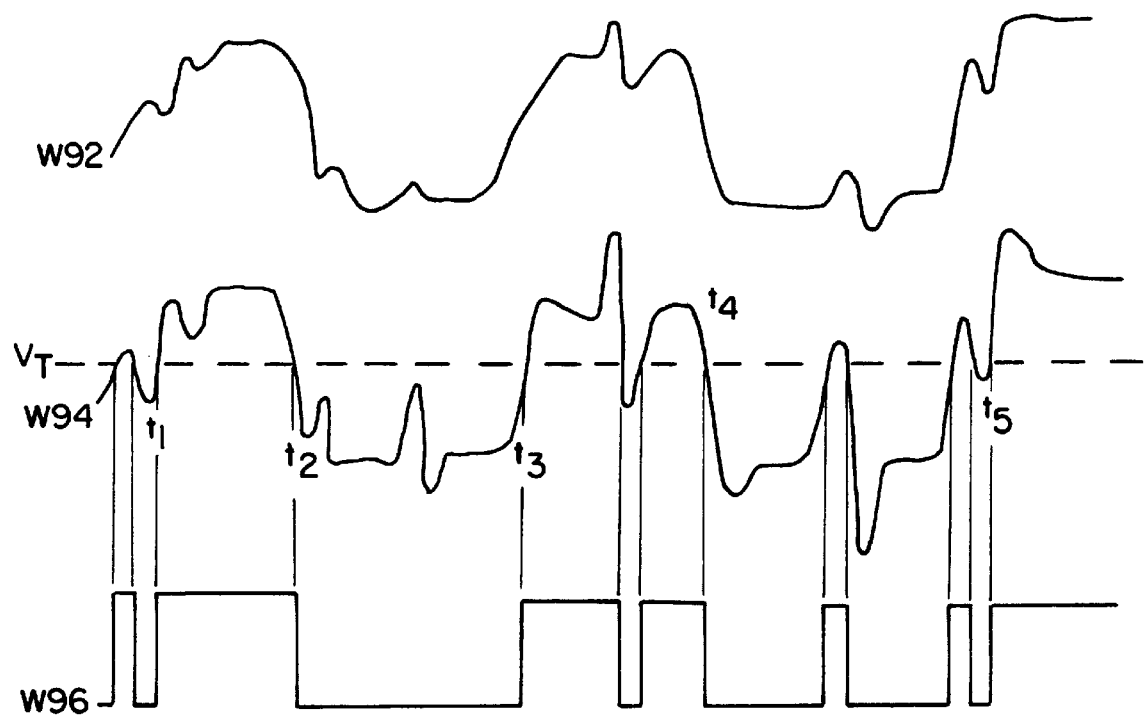
FIG. 6 is a set of waveforms of signals at nodes of the pulse detection circuit shown in FIG. 5.
Figure 7:
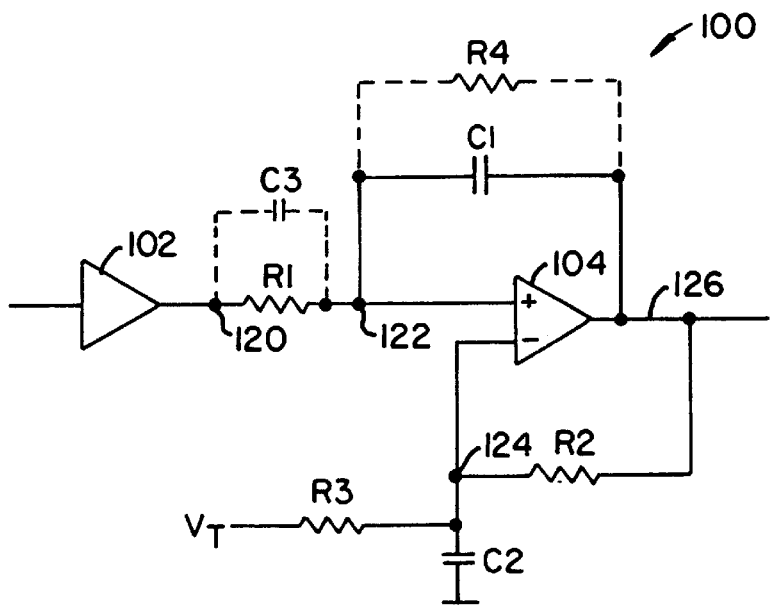
FIG. 7 is a schematic diagram of one embodiment of a pulse detection circuit according to the present invention.

Referring to FIG. 7, one embodiment of a pulse detection circuit 100 according to the present invention is there shown. Pulse detection circuit 100 anticipates the direction of the next transition, but also provides high noise immunity at the transition points to avoid generating multiple transitions on the output for single transition.

Figure 8:
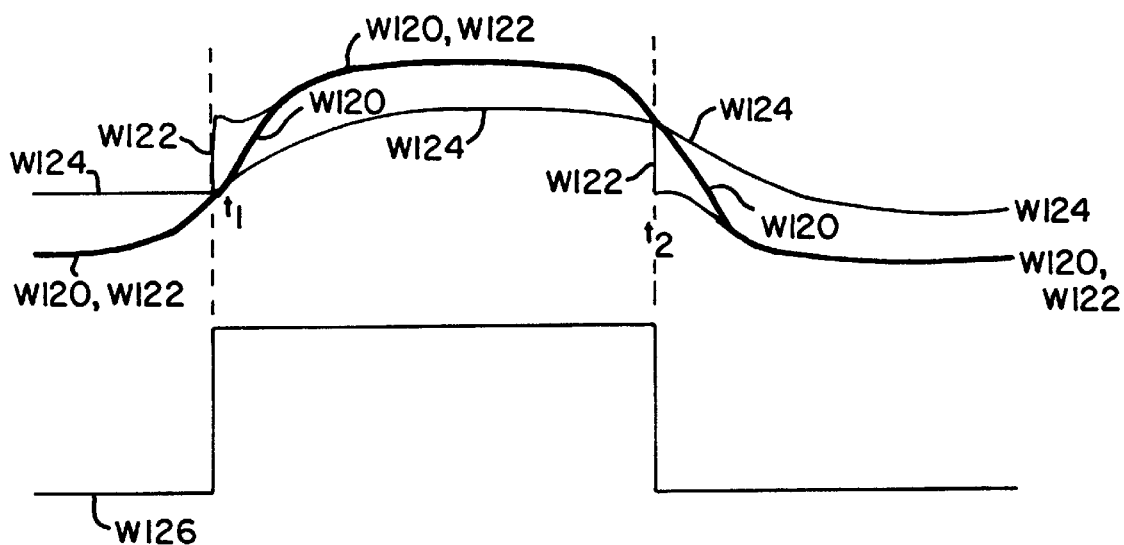
FIG. 8 is a set of waveforms of signals at nodes of the pulse detection circuit shown in FIG. 7.

Pulse detection circuit 100 is shown including an amplifier 102, a comparators 104, capacitors C1 and C2, and resistors R1, R2 and R3. Optionally, a resistor R4 and/or a capacitor C3 are used. Waveforms at nodes 120, 122, 124 and 126 of pulse detection circuit 100 are shown in FIG. 8 as waveforms W120, W122, W124 and W126, respectively.

The operation of pulse detection circuit 100 is based on some knowledge of the input signal, namely the approximate signal timing and approximate signal amplitude. For digital data transmission, the signal timing is usually fixed at a known baud rate, and for analog signals, a minimum time between transitions is usually known. With a two-level signal, it can also be assumed that every positive transition is followed by a negative transition and vice versa. If the pulse-to-pulse amplitude variation is known, the threshold can be adjusted to reduce delay resulting from the slow transition time of the input signal, Since the signal will have a negative transition after a positive transition, the detection threshold can be moved in the negative direction so comparator 104 will respond with a transition at its output shortly after the input signal level changes at node 120.

An example of this is illustrated by waveform W120 in FIG. 7. The voltage at node 124 (W124), the threshold voltage, is kept away from the compared voltage at node 122 (W122) so that comparator 104 is not too sensitive to noise. The values of R2, C2, and R3 are selected such that the voltage at node 124 moves to a level set away from the voltage at node 122 by the time the next signal transition is expected. Node 122 receives positive feedback from node 126 to create a large, temporary hysteresis. This will provide ample noise immunity while the input signal is transitioning. The values of R1 and C1 are selected such that hysteresis is largely nonexistent when the next signal transition is expected.

The component values in pulse detection circuit 100 should be set based on some knowledge of the input signal for optimum performance. For example, if interference occurs only around the time of signal transitions, R2 C2 and R3 can be valued such that node 124 stays closer to the value of the input signal at node 120, to shorten the signal transition detection delay. The amount of hysteresis should be as large as possible, but not so large that the effect of the hysteresis is nonneglibible when the next signal transition is expected.

Figure 9:
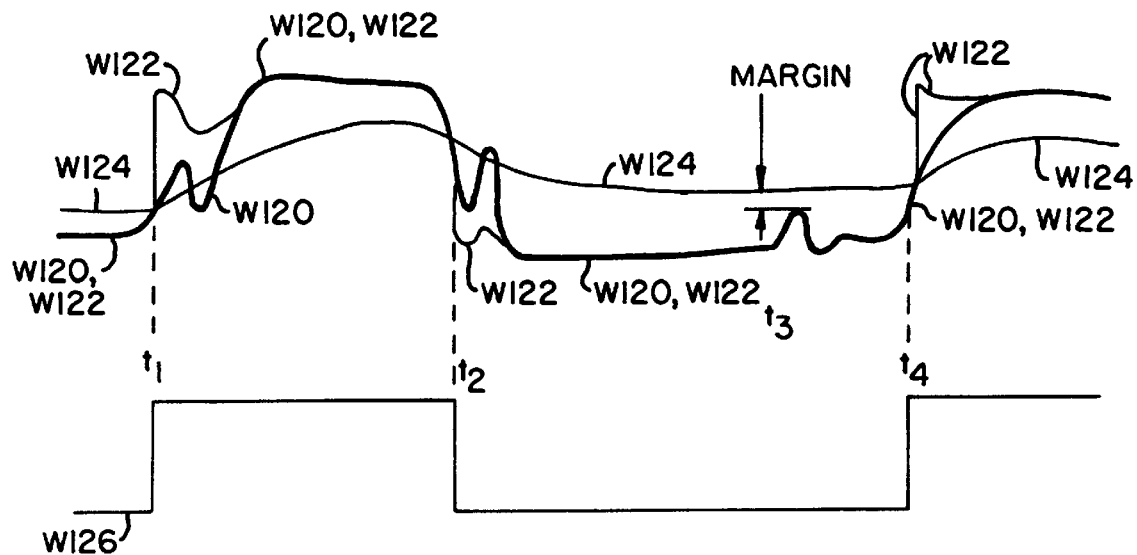
FIG. 9 is an additional set of waveforms representing a response of the circuit of FIG. 7 to a noisy input signal.

Referring now to FIG. 9, a set of waveforms is there shown which relate to the identified nodes of pulse detection circuit 100 shown in FIG. 7 for an input signal with noise. Waveform W120 is shown with a noise spike near times t1, t2 and t3 which, with some less robust pulse detector might result in a spurious pulse detection. However, as shown by waveform W126, the actual pulse is correctly detected. The hysteresis provided by the circuit moves the voltage at node 122 up sharply once a pulse is detected as the signal at node 122 crosses the voltage at node 124. Note that node 122 stays significantly higher than node 120 for long enough to avoid the noise but not long enough to miss the transition at t2. At t2, the voltage at node 122 drops sharply once the transition is detected again avoiding nose in the region of the transition. As FIG. 7 shows, the transition at output node 126 occurs when there is a change in sign of the relative voltage between nodes 122 and 124. Since node 124 is held away from the expected signal amplitude, ample margin exists for noise to occur between transitions, such as at time t3. At t3, noise on the signal input which does not exceed the voltage on node 124 will not cause a positive transition at output node 126.

As can be seen, if the time constants of the R-C networks are chosen properly, exceptional noise immunity for the transitions can be achieved. The noise at t1 and t2 does not affect the circuit because of the large temporary hysteresis provided at node 122. The noise at t3 also does not cause a problem, because the R2/R3 ratio has been chosen with enough margin. The signal-to-noise ratio does not change in the circuit, as it has a flat frequency response. Delay reduction is achieved by manipulating the detection threshold based on some known properties of the incoming signal.

Figure 10:
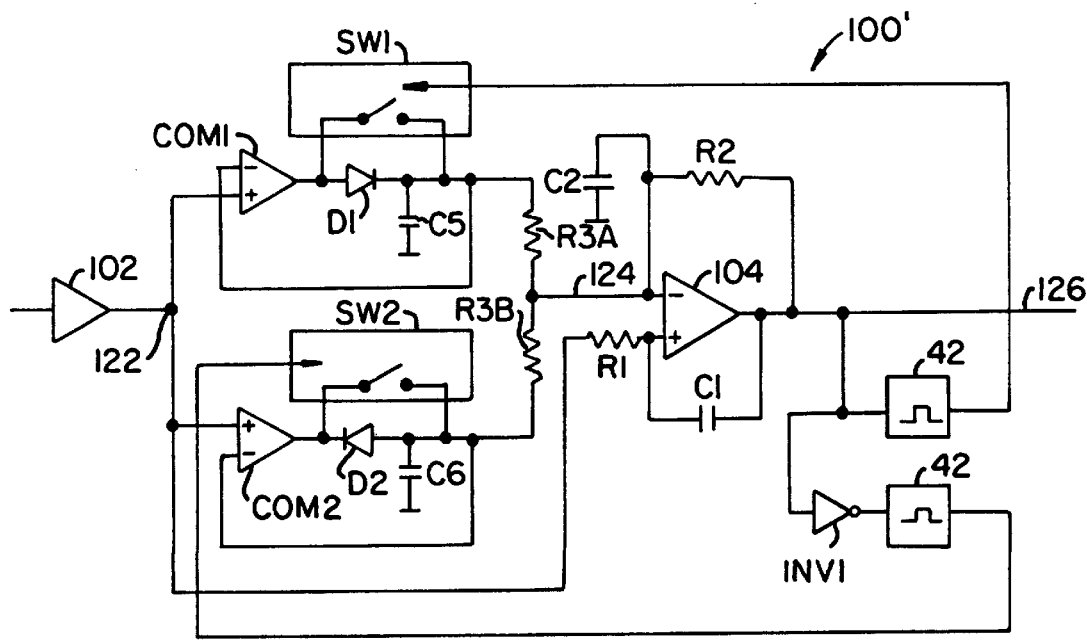
FIG. 10 is another embodiment of a pulse detection circuit according to the present invention which includes resetable peak detectors.

If the incoming signal amplitude varies greatly, the detection threshold can be manipulated by resetable peak detectors as shown by a modified pulse detection circuit 100' shown in FIG. 10. Merely by way of example, referring to the pulse detection circuit 100, R2, R3 and C2 might be replaced by a digital timing circuit which alters a voltage at node 124 based on criteria of the input signal. Furthermore, C1 and R1 might also be replaced by a digital timing circuit.

Figure 11:
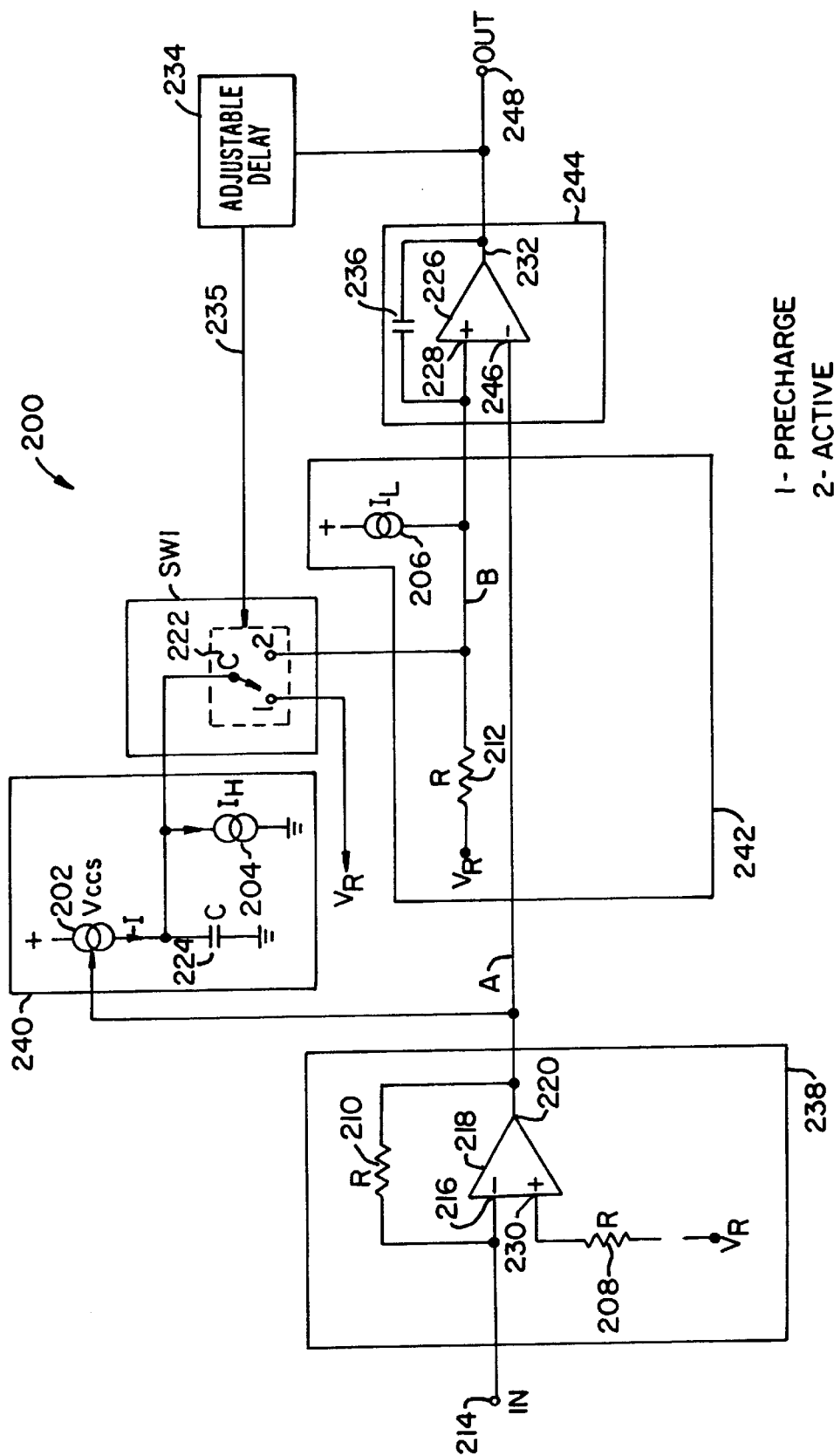
FIG. 11 is a schematic diagram of another embodiment of a pulse detection circuit according to the present invention.

In monolithic integrated circuits, it is difficult to make small resistors with large resistance values. In an alternate embodiment of a circuit according to the present invention, fewer high value resistors are used. FIG. 11 is a diagram of such a circuit 200. The circuit 200 relies on current sources 202, 204 and 206, which are easy to implement in silicon and are precision components by nature. Circuit 200 can operate with only three resistors, 208, 210 and 212. Each of these resistors has equal values, making them easy to match. The three current sources operate in a selected ratio to each other. The circuit is designed to take an input at node 214, which is connected to the negative terminal 216 of amplifier 218. The amplifier generates a voltage signal A representative of the input signal at the amplifier output 220 and across the resistor 210 which is located in the negative feedback path of the amplifier 218. Amplifier 218 and its associated circuitry operate as a transconductance amplifier stage 238. The voltage A is also presented to the input of a voltage controlled current source (VCCS) 202, wherein voltage A is converted into current I and input into the center position 22 of switch SW1 and to filter capacitor 224. SW1 has position 1 which is a precharge position and position 2 which is an active position. Another current source 204 draws a fixed amount of current from the output of the current source 202 which establishes a high offset level for the signal detection circuit. The combination of 202, 204 and 224 form a biasing circuit 240. Another current source 206 is connected to the positive input 228 of comparator 226 and generates a voltage B across the resistor 212. Resistor 212 is connected from the positive input 228 of the comparator 226 to a voltage reference $V_R$. This provides the low offset level for the signal detection circuit. The combination of 206 and 212 forms a biasing circuit 242. The circuit's signal detection threshold is varied by the switch SW1 to provide minimum detection time for a signal change. Both offset levels are independently adjustable. Since the resistors are equal and matched to each other and the current sources all matched amongst each other, the circuit is not sensitive to the absolute value of the components, only to how well they are matched to each other. A third resistor 208 connected between positive terminal 230 and $V_R$ and is only there to balance the input voltage to the amplifier 218 and cancel the effect the input bias current has on the differential voltage of the amplifier. The switch SW1 is controlled by control line 235, which is generated by the output 232 of the comparator 226 and a delay circuit 234. Signal transitions on the output 232 are delayed by delay circuit 234 an are then used to toggle the switch SW1 via control line 235. By delaying the switch from switching too quickly, a measure of noise immunity can be achieved. Delay circuit 234 is adjustable allowing a maximum noise immunity delay time to be configured as appropriate. Position 1 of SW1 connects current source 202 to $V_R$ so that the filter capacitor 224 is pre-charged to a zero input current condition. A capacitor 236 between the positive input 228 and output 232 of the comparator 226 provides positive feedback and a large temporary offset at the input of the comparator, which results in exceptional noise immunity after each signal transition. Comparator 226 and capacitor 236 form comparator circuit 244. The output of amplifier 238 is input to the negative terminal 246 of comparator 226. Comparator 226 compares the A signal at negative input 246 with the B signal at positive input 228 to produce the detected output signal 248. In this embodiment, the B signal functions as a bias signal for comparator 228.

Figure 12:
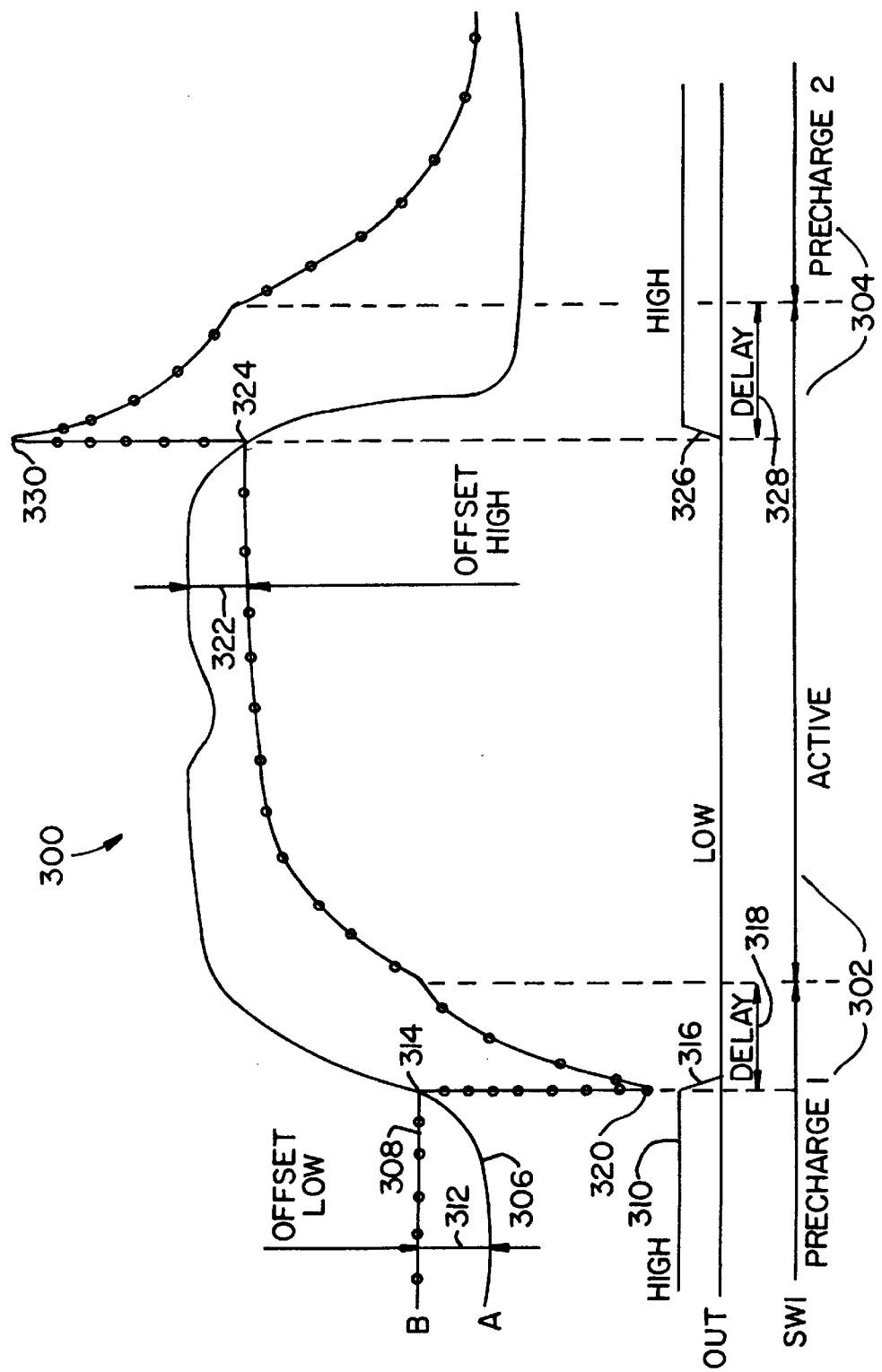
FIG. 12 is a timing diagram depicting the operation of the embodiment of FIG. 11.

FIG. 12 is a timing diagram 300 depicting waveforms produced by the operation of circuit 200. The operation of SW1 between the precharge and the active states is shown at 302. Waveform 306 depicts the output A of the transconductance amplifier stage 238. Waveform 308 depicts the threshold voltage B generated by operation of switch SW1. Waveform 310 depicts the output signal 248 as a result of the operation of the circuit 200.

As depicted in FIG. 12, when SW1 is in the precharge1 332 time period, signal 306 which represents the signal A is below the low offset level established by circuit 242 as shown at 312. As a result, the output waveform 310 is in the high state 311. When signal A begins the exceed the B threshold as shown at 314, the output waveform 310 goes to a low state as shown at 316 and triggers a delay time period 318 to begin. The delay time period being set by adjustable delay 234. During the delay time period 318, threshold B moves to a very low state shown at 320, thereby providing immunity against noise as signal A increases, which might otherwise appear on the output waveform 310. At the end of the delay time period 318, adjustable delay 234 signals SW1 via control line 235 to switch to the active state 334. In the active state, threshold B moves to a new threshold level below the level of signal A creating an offset high level as shown at 322. When signal A moves below the level set by threshold B as shown at 324, the output waveform transitions to a high level as shown at 326 and triggers another delay period 328 to begin. At the start of delay period 328, signal B moves to a very high state shown at 330, thereby providing immunity against noise as signal A decreases, which might otherwise appear on the output waveform 310. At the end of delay period 328, adjustable delay 234 signals SW1 via control line 235 to switch to the precharge state, shown as precharge2 336 for clarity. In the precharge2 state, threshold B moves to a threshold level above the level of signal A, again creating an offset low condition similar to that shown at 312.

As can be readily seen, the operation of the circuit 200 constructed according to the teachings of the present invention, provides signal detection capabilities coupled with noise immunity features. The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A pulse detection circuit for filtering a pulse signal with noise superimposed thereon into a digital bi-level signal representing the pulse signal, the circuit comprising:

a comparator comparing the pulse signal at a first input terminal to a bias signal at a second input terminal to produce a digital bi-level representing the pulse signal;

a delay circuit coupled to said comparator to receive said digital bi-level signal to produce a delayed version of said digital bi-level signal representing the pulse signal; and a biasing circuit coupled to receive the pulsed signal to produce said bias signal at a bias output terminal that is coupled to the second input terminal, said biasing circuit includes a switch having a switch input terminal that is coupled to the delay circuit to receive said delayed version of said digital bi-level signal representing the pulse signal, wherein said bias signal is switched between a first and a second state responsive to said delayed version of said digital bi-level signal representing the pulse signal.

2. The pulse detection circuit of claim 1 wherein said biasing circuit comprises a first biasing circuit and a second biasing circuit, said first biasing circuit comprising a first resistor coupled to a first current source and a reference signal.

3. The pulse detection circuit of claim 2 wherein said second biasing circuit comprises a second current source coupled to the pulse signal.

4. The pulse detection circuit of claim 1 wherein said delay circuit comprises an adjustable delay circuit wherein said delayed version of said digital bi-level signal is adjustably delayed.

5. A method for filtering a pulse signal with noise superimposed thereon into a digital bi-level signal representing the pulse signal, the method comprising steps of:

receiving the pulsed signal to produce a bias signal, said bias signal having a first and a second state;

comparing the pulse signal to said bias signal to produce a digital bi-level signal representing the pulse signal;

delaying said digital bi-level signal to produce a delayed version of said digital bi-level signal representing the pulse signal; and switching said bias signal between said first and second states responsive to said delayed version of said digital bi-level signal representing the pulse signal.

6. The method of claim 5, wherein the step of delaying comprises a step of adjustably delaying said digital bi-level signal to produce the delayed version of said digital bi-level signal representing the pulse signal.

* * * * *